(12) United States Patent
Pishdadian

(10) Patent No.: US 9,472,953 B2
(45) Date of Patent: Oct. 18, 2016

(54) DYNAMIC HIGH ENERGY SWITCH

(71) Applicant: Hamid Pishdadian, Warwick, RI (US)

(72) Inventor: Hamid Pishdadian, Warwick, RI (US)

( * ) Notice: Subject to any disclaimer, the term of this patent is extended or adjusted under 35 U.S.C. 154(b) by 0 days.

(21) Appl. No.: 14/589,663

(22) Filed: Jan. 5, 2015

(65) Prior Publication Data

US 2015/0303694 A1 Oct. 22, 2015

Related U.S. Application Data

(63) Continuation of application No. 13/754,757, filed on Jan. 30, 2013, now Pat. No. 8,928,173.

(51) Int. Cl.
| | |
|---|---|
| *G05F 1/70* | (2006.01) |
| *H02J 3/18* | (2006.01) |
| *H03K 17/725* | (2006.01) |
| *H03K 17/79* | (2006.01) |

(52) U.S. Cl.
CPC ............. *H02J 3/1821* (2013.01); *G05F 1/70* (2013.01); *H02J 3/1864* (2013.01); *H03K 17/725* (2013.01); *H03K 17/79* (2013.01); *Y02E 40/12* (2013.01); *Y10T 307/625* (2015.04)

(58) Field of Classification Search
CPC ........... H02M 5/2573; H02M 5/2576; H02M 2003/1555; G05F 1/44; H05B 41/40; H05B 41/3924
USPC .......... 307/44, 46, 48, 64, 66, 74; 323/207, 323/222, 224, 237, 239, 247, 282–285
See application file for complete search history.

(56) References Cited

U.S. PATENT DOCUMENTS

| | | | | |
|---|---|---|---|---|
| 4,008,416 | A * | 2/1977 | Nakasone | H05B 39/02 315/194 |
| 5,517,106 | A | 5/1996 | Longini | 324/142 |
| 5,523,541 | A | 6/1996 | Ishikawa | 219/110 |
| 5,621,627 | A * | 4/1997 | Krawchuk | H02M 5/458 363/37 |
| 5,652,504 | A * | 7/1997 | Bangerter | G05F 1/45 323/211 |
| 5,754,036 | A * | 5/1998 | Walker | H02M 5/2573 323/235 |
| 6,114,813 | A * | 9/2000 | Lo | H05B 37/0218 250/214 AL |
| 6,191,563 | B1 | 2/2001 | Bangerter | 323/211 |
| 7,902,769 | B2 * | 3/2011 | Shteynberg | H05B 33/0815 315/291 |
| 8,432,064 | B2 | 4/2013 | Maeda | 307/46 |
| 8,993,787 | B2 * | 3/2015 | Cho | B01D 3/009 203/14 |
| 2008/0025056 | A1 | 1/2008 | Chen | |

OTHER PUBLICATIONS

International Search Report and Opinion PCT/US14/013085 (applicant) Jun. 9, 2014, Reference supplied in parent case U.S. Appl. No. 13/754,757.

* cited by examiner

*Primary Examiner* — Rajnikant Patel
(74) *Attorney, Agent, or Firm* — Clifford H. Kraft

(57) ABSTRACT

A dynamic high-energy switch used for correcting load imbalance through connecting and disconnecting capacitance in a power feed circuit.

10 Claims, 1 Drawing Sheet

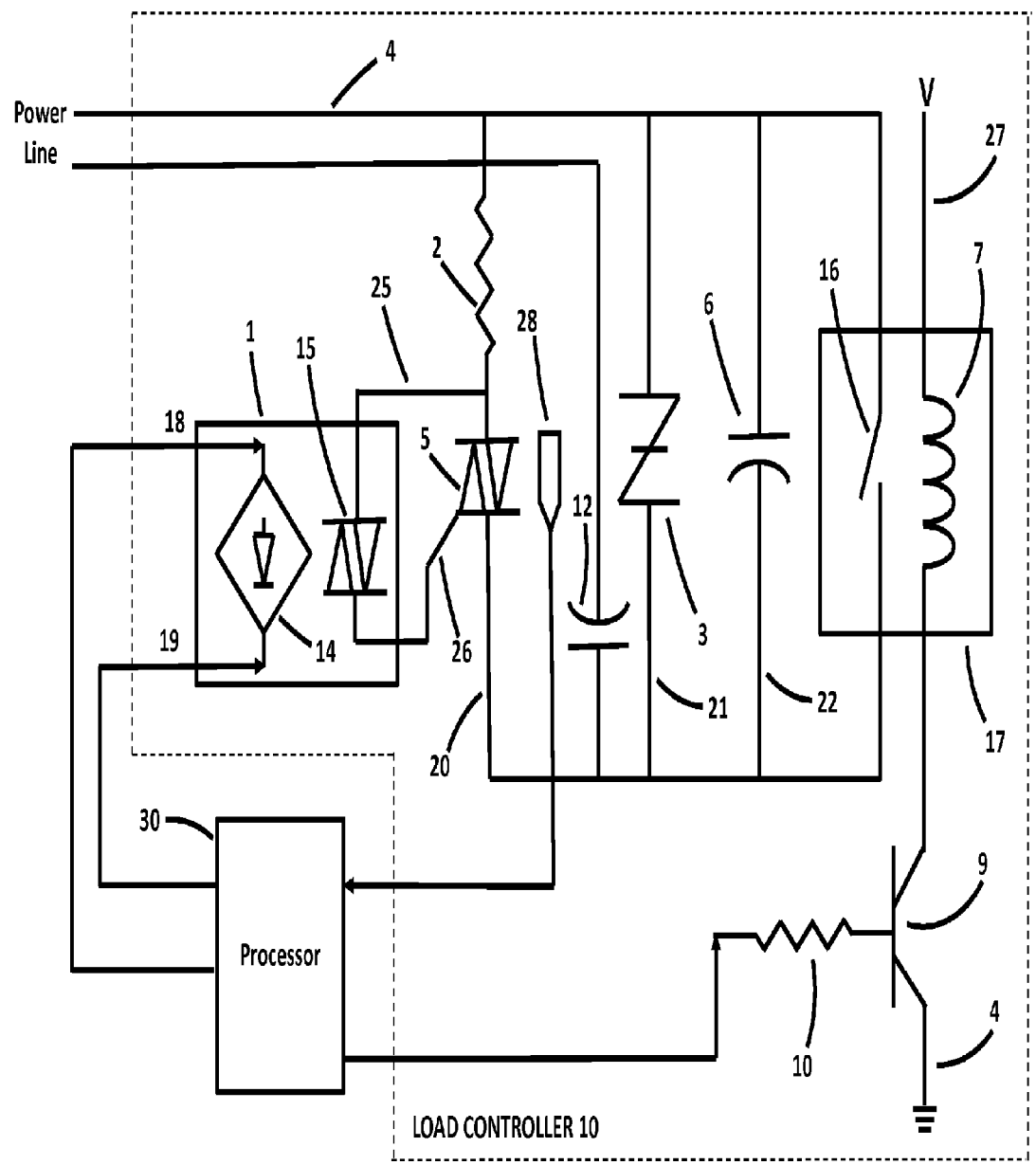

DYNAMIC HIGH ENERGY SWITCH

This is a continuation of application Ser. No. 13/754,757 filed Jan. 30, 2013, now U.S. Pat. No. 8,928,173 issued Jan. 6, 2015. Application Ser. No. 13/754,757 is hereby incorporated by reference in its entirety.

FIELD OF INVENTION

This invention relates to switching circuits. More specifically, effectively switching on and off a capacitor or capacitor bank within a closed system. This invention is applicable to various applications such as arc welding, magnetizing materials, and switching capacitors.

BACKGROUND OF THE INVENTION

Traditionally electronic switches have been unable to switch high-energy loads effectively resulting in damage to the switch, the capacitor, and the devices to which power is being provided. Effective resolution of this problem has been too costly and, without a switch that could effectively switch high-energy capacitors in and out of a circuit, the state of the art has been unable to provide suitable avenues of controlling the power imbalance issues and other related problems. The state of the art today, and for the past several decades, has been to use switch circuits that require a certain amount of current to bias their base and this current is typically used to induce the line voltage. Consequently, it was impossible not to cause damage to switches, capacitors and even motors simply because there was no way to effectively switch capacitance in and out of high power circuits in such a way to efficiently resolve imbalance and harmonics issues.

Currently there are no high-energy power line capacitor switching systems that match the voltage across a capacitor to the line voltage at the time the switch contact is made. In addition, there is no practical way that a capacitor can be discharged rapidly so that it can to switched on and rapidly charged, or that guarantees that the capacitor is kept in its discharge state in the event of a power loss.

The ever-increasing demand for electrical energy has triggered greater efforts to attain higher efficiency in every aspect of energy switching in the electrical power industry. Many providers and regulators have sought to address the ever-increasing demand and rising cost by looking at power factor correction (reactive power) and more importantly, load imbalance correction and harmonic distortion remedies. As we have experienced there have been many efforts to increase efficiency, reduce power consumption, and mitigate power delivery costs but these efforts have not effectively addressed the growing problem described above.

Thus, there is a need in the art for a novel, high-energy switching circuit that reduces energy consumption by high power loads.

SUMMARY OF THE INVENTION

The present invention provides a novel switching circuit that can safely transfer energy from a an electrical power source to a load while overcoming the above described and other deficiencies of conventional circuit protection devices and power switching devices.

The invention comprises a resister along with a high-energy triac switch, which in combination together, achieve the desired means of releasing capacitance when required to correct for imbalance and harmonic distortion.

This invention allows for use in a variety of electrical systems where high-energy capacitance is utilized. Thus the scope of the disclosed invention should be determined by the appended claims and their legal equivalents, rather than the examples given.

BRIEF DESCRIPTION OF THE DRAWINGS

The invention will be better understood upon reading the following Detailed Description in conjunction with the Drawings in which:

FIG. 1 is a schematic diagram of the novel dynamic switch.

DETAILED DESCRIPTION

The present invention provides a novel capacitor switching system that can safely transfer energy from a source to a load while overcoming the deficiencies of conventional circuit protection devices and switching devices.

In FIG. 1 current travels in line 4 and through resistor 2, which limits the current that can flow through opto coupler 1 via lead 25. A control circuit connected to leads 18 and 19 is isolated from other circuitry by the operation of opto coupler 1. The opto coupler operates as a load sensing device that contains diode 14 and a triac 15 that senses operating conditions and establish the zero crossing of the wave-form of the AC current on line 4. When opto coupler 1 is activated by its control circuit triac 15 in opto coupler 1 conducts a flow of current to line 26. Triac 15 allows some of the current passing through resistor 2 to pass onto the gate terminal of triac 5 via line 26. Triac 15 operates as a load comtroller that provides a signal to diode 14 and to the gate aspect of triac 5. Triac 15 is connected to the gate of triac 5 and triac 5 is turned on and it and capacitor 12 conduct the AC current that passes through resistor 2. Thermistor 28 is a device that senses temperature changes of triac 5. Thermistor 28 reports the temperature of triac 5 to a processor (not shown). Processor (not shown) will use reported readings from thermistor 28 to determine opening and closing of triac 5. A processor (not shown) sends a current through diode 14. The processor analyzes operating conditions of the reactive load and the load controlling device and corrects for load imbalance and harmonic distortion. The processor receives data from thermistor 28, lead 19, and resistor 10 and provides feedback to the opto coupler 1 and transistor 9. Some current is transferred from diode 14 to triac 5. Current passing through diode 14 passes to ground via line 18. AC current passing through triac 5 to line 20 passes on to and through capacitor 12 to ground. As the current of the sine wave on line 4 approaches zero in quadrant II of AC wave-form, relay 17 operates and its contact 16 closes when the AC voltages on line 4 and capacitor 12 are near equal. Relay 17 operates as a low voltage load controller that regulates AC voltages that pass to capacitor 12, capacitor 6, and triac 5. Varistors behave like two back-to-back zener diodes to suppress surges in both directions. Varistor 3 provides circuit protection by absorbing voltage spikes and the resulting current from the collapsing magnetic field of the inductance of coil 7 when relay 17 is de-energized and its contact 16 is opened. The inductance of coil 7 operates as a control signal. Varistor 3 allows the line current caused by the voltage spikes to pass to capacitor 12 via line 21. Current passing through varistor 3 passes through capacitor 12 to ground. Varistor 3 is connected in parallel to triac 5 and opto coupler 1. The AC current of line 4 passes to capacitor 6. Any AC current passing through capacitor 6 passes through capacitor 12 via line 22. Contact 16 of relay 17 passes the current on line 4 to and through capacitor 12 when contact 16 is closed. A power source 8 provides a current to coil 7 of relay 17. Relay 17 operates a disconnect means by either the opening or closing of contact 16. When relay 17 is operated and its contact is closed capacitor 6 is bypassed. When contact 16 of relay 17 opens the current flowing through contact 16 is diverted through capacitor 6. When a control signal is applied via resistor 10 to the gate terminal of transistor 9 current flows through transistor 9 and coil 7 of relay 17. Relay 17 is connected in parallel to triac 5 and opto coupler 1.

While what has been described herein is a preferred embodiment of the invention those skilled in the art will understand that numerous changes may be made without departing from the spirit and scope of the invention.

I claim:

1. An AC power load controlling device comprising:
   a processor;
   a pair of power feed lines connected to a load;
   a sensor adapted to measure complex load voltage and current of the load and communicate a value representative of the complex load voltage and current to the processor;
   the sensor comprising an opto-coupler, resistor and at least one triac adapted to shunt a controlled amount of current from the power feed line through the opto-coupler;
   the sensor also including a thermistor that senses temperature of the triac adapted to feed temperature information to the processor;
   a controller receiving a signal from the processor related to the complex load voltage and current;
   a switch in communication with the controller adapted to electrically connect and disconnect reactive load control elements to and from the connected load upon receiving a signal from the controller thereby correcting load imbalance and harmonic distortion.

2. The AC power load controlling device of claim 1 wherein the processor locates a load voltage time point between pi/2 and 3pi/4 every cycle at which to make corrections.

3. The AC power load controlling device of claim 1 wherein the processor determines when load current phase equals load voltage phase.

4. The AC power load controlling device of claim 1 further comprising a phase correction capacitor, wherein the controller activates the switch to discharge the phase correction capacitor as part of phase correction.

5. The AC power load controlling device of claim 1 wherein the controller is a transistor.

6. The AC power load controlling device of claim 1 wherein the switch is a relay, said relay having a switch portion and a coil portion.

7. The AC power load controlling device of claim 6 further comprising a varistor connected across said switch portion.

8. An AC power load controlling device comprising:
   a processor driving a power transistor, the power transistor causing a relay to close when said power transistor conducts;
   a surge protection device connected across said relay;
   a capacitor also connected across said relay;
   the relay, surge protection device and capacitor connected across a AC power line that is connected to a load circuit;
   a sensing circuit adapted to sample a portion of current flowing through said load, the sensing circuit providing a signal to the processor indicative of phase and harmonic distortion of said current;
   wherein, the processor causes the relay to open and close switching the capacitor in and out of the load circuit controlling phase and harmonic distortion of said current.

9. The AC power load controlling device of claim 8 wherein said surge protection device is a varistor.

10. The AC power load controlling device of claim 8 wherein said sensing circuit includes an opto-coupler and at least one triac.

* * * * *